(12) United States Patent
Sharan et al.

(10) Patent No.: US 6,921,708 B1
(45) Date of Patent: Jul. 26, 2005

(54) INTEGRATED CIRCUITS HAVING LOW RESISTIVITY CONTACTS AND THE FORMATION THEREOF USING AN IN SITU PLASMA DOPING AND CLEAN

(75) Inventors: Sujit Sharan, Boise, ID (US); Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/549,214

(22) Filed: Apr. 13, 2000

(51) Int. Cl.$^7$ ............................................. H01L 21/26
(52) U.S. Cl. ..................... 438/513; 438/694; 438/723
(58) Field of Search ............................ 438/513, 694, 438/723, 906, 523, 710, 729, 530, 565, 707, 909, 918, 584, 618, 597, 621, 638, 643, 659, 672, 689, 514, 522, 524, 629, 630, 637, 648, 649, 655, 656, 695, 715; 257/607, 610, 622, 41

(56) References Cited

U.S. PATENT DOCUMENTS

| | | | |
|---|---|---|---|
| 4,131,488 A | 12/1978 | Lesk et al. | |
| 4,434,036 A | * 2/1984 | Hoerschelmann et al. | 438/513 |
| 4,734,383 A | 3/1988 | Ikeda et al. | |
| 4,837,172 A | 6/1989 | Mizuno et al. | 438/475 |
| 4,861,729 A | * 8/1989 | Fuse et al. | 437/18 |
| 4,910,160 A | 3/1990 | Jennings et al. | 438/17 |
| 4,912,065 A | 3/1990 | Mizuno et al. | 438/301 |
| 4,937,205 A | 6/1990 | Nakayama et al. | 438/513 |
| 5,067,002 A | 11/1991 | Zdebel et al. | 257/756 |
| 5,122,482 A | * 6/1992 | Hayashi et al. | 437/225 |
| 5,310,711 A | * 5/1994 | Drowley et al. | 437/141 |
| 5,338,697 A | * 8/1994 | Aoki et al. | 437/40 |
| 5,387,545 A | * 2/1995 | Kiyota et al. | 437/165 |
| 5,403,436 A | * 4/1995 | Fujimura et al. | 156/643 |
| 5,489,550 A | * 2/1996 | Moslehi | 438/565 |
| 5,514,603 A | * 5/1996 | Sato | 438/105 |
| 5,851,906 A | 12/1998 | Mizuno et al. | 438/513 |
| 6,020,254 A | * 2/2000 | Taguwa | 438/618 |
| 6,048,782 A | * 4/2000 | Moslehi | 438/565 |
| 6,051,492 A | * 4/2000 | Park et al. | 438/637 |
| 6,259,118 B1 | 7/2001 | Kadosh et al. | 257/67 |
| 6,300,644 B1 | 10/2001 | Beckhart et al. | 250/559.33 |
| 6,300,664 B1 | 10/2001 | Kuroi et al. | 257/410 |
| 2003/0015496 A1 | 1/2003 | Sharan et al. | |

FOREIGN PATENT DOCUMENTS

| | | | |
|---|---|---|---|
| JP | 02-159028 | * | 6/1990 |
| JP | 02-159028 A | * | 6/1990 |

OTHER PUBLICATIONS

U.S. Appl. No. 09/360,292, filed Jul. 22, 1999, Sharan et al.

* cited by examiner

Primary Examiner—George Fourson
Assistant Examiner—Julio J. Maldonado
(74) Attorney, Agent, or Firm—Klarquist Sparkman, LLP

(57) ABSTRACT

Contact areas comprising doped semiconductor material at the bottom of contact holes are cleaned in a hot hydrogen plasma and exposed in situ during and/or separately from the hot hydrogen clean to a plasma containing the same dopant species as in the semiconductor material so as to partially, completely, or more than completely offset any loss of dopant due to the hot hydrogen clean. A protective conductive layer such as a metal silicide is then formed over the contact area in situ. The resulting integrated circuit has contacts with interfaces such as a silicide interfaces to contact areas having a particularly favorable dopant profile and concentration adjacent the silicide interfaces.

15 Claims, 4 Drawing Sheets

INTEGRATED CIRCUITS HAVING LOW RESISTIVITY CONTACTS AND THE FORMATION THEREOF USING AN IN SITU PLASMA DOPING AND CLEAN

FIELD

The present invention relates to integrated circuits and other semiconductor devices and to methods for the fabrication thereof, and particularly to integrated circuits having low resistivity, high aspect ratio contacts, and methods for the fabrication thereof.

BACKGROUND

In the continuing quest for more powerful, less expensive integrated circuits, size matters. The smaller the individual circuit features, the more memory space or computing power can be packed into a given area. But circuits with very small feature sizes can be difficult to produce.

Small feature sizes cause particular problems in contact formation. Contacts are regions of electrically conductive material that provide an electrical connection (a "contact") between separate elements or portions of an integrated circuit, typically between an underlying portion of an integrated circuit and an overlying portion. As feature sizes decrease, the aspect ratio, ratio of height (or depth) to width, of such contacts generally increases. With narrower, taller contacts, the resistivity of the contact, and particularly of the junction between the contact and the circuit element or portion below it, must be kept sufficiently low. Otherwise, the electrical connection (the contact) may fail, possibly causing failure of the entire integrated circuit.

Contacts are typically formed in the following general way: A generally planar semiconductor structure has already been formed, including thereon or therein a contact area to which the contact is to be electrically connected. A layer of electrically insulating material is then formed upon the semiconductor circuit structure. A contact hole is then formed down into the insulating material above the contact area. The hole is typically formed by a patterning process, such as masking followed by a vertical anisotropic etch. The contact area at the bottom of the contact hole is then cleaned and a conductive material is deposited in the contact hole to form the contact.

For contacts with high aspect ratios, highly directional etch processes are used to form the contact holes. Such processes typically include carbon-based polymer-forming constituents in the etch plasma. After such an etch, the contact area at the bottom of the contact hole is typically contaminated or covered with residue from the etch process. The etch residue must be removed to allow the subsequently deposited conductive material to form a low resistivity contact with the contact area. A native oxide layer is also typically present on the contact area and must also be removed to allow formation of a low resistivity contact.

The semiconductor structures generally include a semiconductor substrate that is doped with a dopant such as boron or other dopants. The processing of the semiconductor structures can cause dopants to diffuse out of, or otherwise be removed from, regions or which the dopants are needed. In addition, even if the dopants remain, processing can "deactivate" the dopants so that they become unavailable.

SUMMARY

The present invention provides integrated circuits having low resistivity, high aspect ratio contacts, and methods for forming such circuits.

In one specific embodiment, contact areas comprising doped semiconductor material at the bottom of the contact holes are cleaned, in a cleaning plasma, desirably a hot hydrogen plasma. The contact holes and contact areas are also exposed in situ during and/or separately from the hot hydrogen clean to a plasma containing the same dopant species as in the doped semiconductor material forming the contact areas. Exposure to the dopant species in the plasma partially, completely, or more than completely offsets any loss of dopant due to the plasma clean, allowing good control of the dopant profile adjacent to the surface of the contact area. A protective conductive layer such as a metal silicide may then be formed over the surface of the contact area in situ, and a contact plug may also be formed thereafter over the protective layer.

The resulting integrated circuit has contacts with interfaces, such as silicide interfaces, to contact areas that have a particularly favorable dopant profile and concentration near the interfaces. For example, the dopant concentration in the contact area may be in the range of about $10^{18}$–$10^{21}$ atoms per cubic centimeter somewhere within a distance of about 500 Angstroms or less from the interface with the contact. This allows reliable formation of high resolution high aspect ratio contacts (with aspect ratios as high as 8:1 or higher), having resistances which may, for example, be equal to or less than about 1000 Ω. Particular advantages and features of the invention will be apparent from the detailed description below.

DETAILED DESCRIPTION

Figure 1:
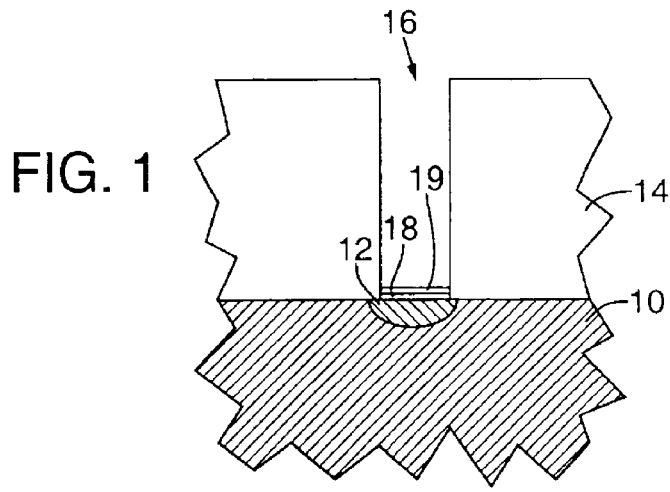
FIG. 1 is a partial cross section of a semiconductor device, such as an integrated circuit, in fabrication, in which a low resistivity contact of the present invention may be formed the methods of the present invention.

FIG. 1 shows a partial local cross-section of a semiconductor device under fabrication, such as an integrated circuit. The device under fabrication is typically one of many being fabricated together in and on a semiconductor wafer or the like. A semiconductor structure 10 comprising part of the device under fabrication includes a contact area 12 formed therein or thereon. An electrically insulating layer 14 has been formed on the semiconductor structure 10, and a contact hole 16 has been formed in the insulating layer 14 over the contact area 12. The contact area 12 is comprised of a doped semiconductor material.

Contact holes such as the contact hole 16 are formed via an anisotropic etch process. The anisotropic etch process leaves etch debris 19, such as carbon compounds, in the contact hole 16, including on the contact area 12. The etch debris 19 must be removed before the contact is formed in order to allow reliable formation of a low-resistivity electrical connection to the contact area 12. A layer of native oxide 18 found on the contact area 12 can be somewhat disrupted or damaged by the anisotropic etch process, but is not typically removed thereby. Any such native oxide 18 is also removed to allow reliable low-resistivity contact formation.

Note that the drawings are scaled for ease of representation only, and not for dimensional accuracy. The aspect ratio of the contact hole can be as great as 8:1 or even more, making the contact hole quite difficult to clean, particularly with standard wet cleans. For example, the contact hole may be 2.5 $\mu$m deep. Resistivity of such high aspect ratio contacts must generally be kept sufficiently low that the contact resistance is below 5000 $\Omega$ or the contact will typically fail. Contact resistance is desirably kept at about 1000 $\Omega$ or less.

Figure 2:
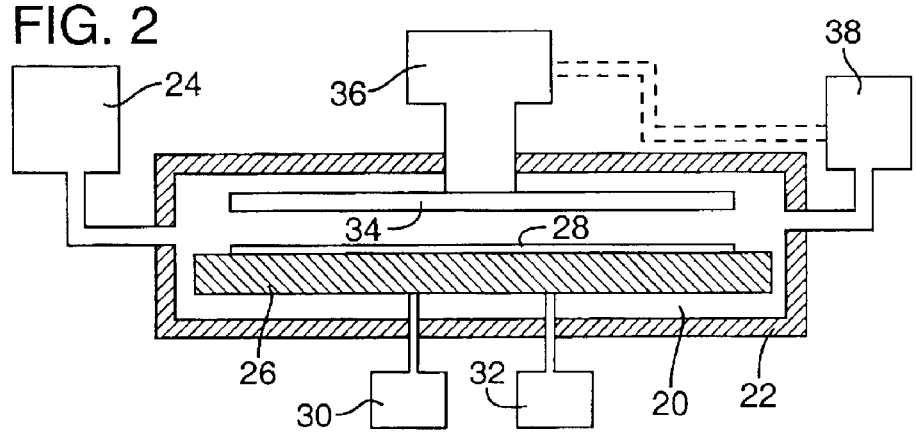
FIG. 2 is a semi-schematic diagram of a process chamber in which methods of the present invention may be practiced.
Figure 3:
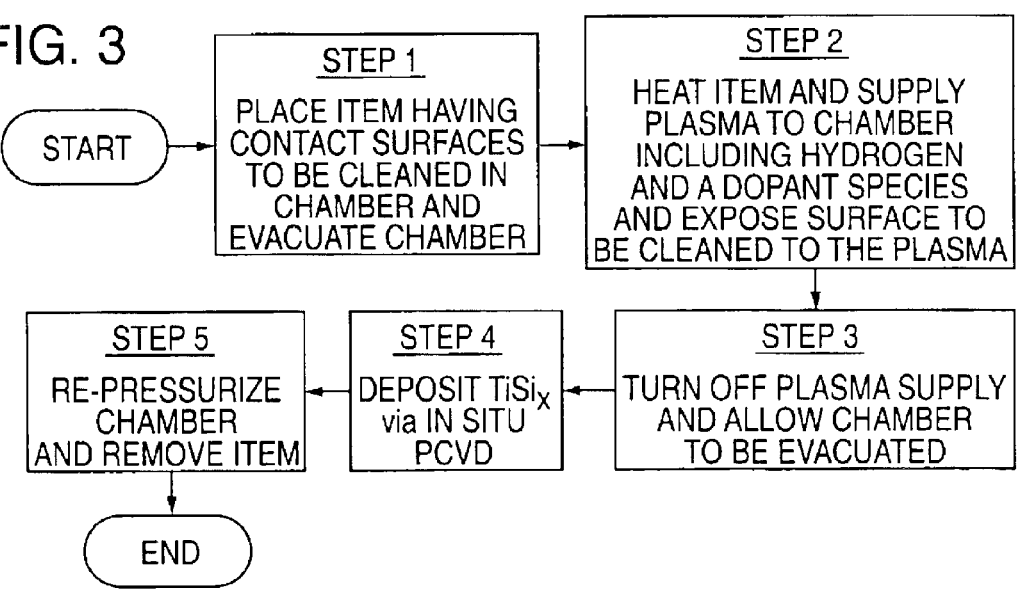
FIG. 3 is a flow chart illustrating the basic steps of the methods of the present invention.

FIG. 3 is a flow chart outlining one example process by which a low resistivity, high aspect ratio contact is formed. In step 1, the semiconductor wafer or the like 28, on which the device in fabrication is being fabricated, is placed on (or remains on) a susceptor 26 in a vacuum chamber 22 as shown in FIG. 2. A vacuum pump or similar device 24 evacuates (or maintains the evacuated state of) the interior 20 of the vacuum chamber 22 to a pressure in the range for example of about 1 to about 5 Torr. (If the immediately prior process, such as the anisotropic etch, was performed in the same vacuum chamber 22, then these initial steps are omitted, or modified as suggested parenthetically above). A heating device and temperature controller 32 heats the susceptor 26 to a temperature which is typically at least about 600° C., desirably at least 650° C. An inert gas such as argon may be supplied from a gas source 38 to purge the chamber and assist in pressure and temperature stabilization.

Figure 5:
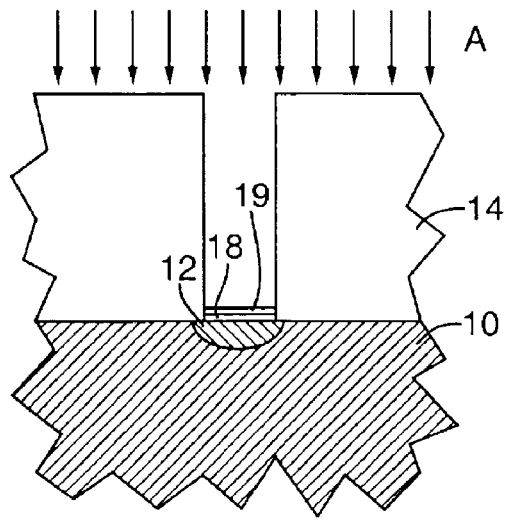
FIG. 5 is a cross section of a semiconductor device in fabrication according to the methods of the present invention.

In step 2, a plasma is then struck in the vacuum chamber 22 and the device in fabrication is exposed to the plasma or to particles therefrom. A plasma generator 36 may be of any suitable type, and may include an electrode or coil 34 excited by RF or DC power. Gases for the plasma may be supplied directly to the chamber 22 from a gas source such as gas source 38 or through the plasma generator from a gas source such as gas source 38. The susceptor 26 and the wafer or the like 28 thereon may be biased by a voltage/power source 30, with a bias voltage in the range of 0V to –500V, desirably in the range of 0 to –200V, inducing directionality in plasma ions in the direction of arrows A shown in FIG. 5. RF power, with or without the DC bias, may also be supplied to the susceptor by the voltage/power source 30, if desired.

During exposure to plasma in the vacuum chamber in step 2, the device under fabrication is exposed to both a hydrogen plasma (a hydrogen-containing plasma) and a dopant-containing plasma. The dopant of the dopant-containing plasma may be any dopant although desirably the dopant may be selected to be the same as the dopant, or as the dominant dopant, in the doped semiconductor material of which the contact area 12 is comprised.

Figure 6:
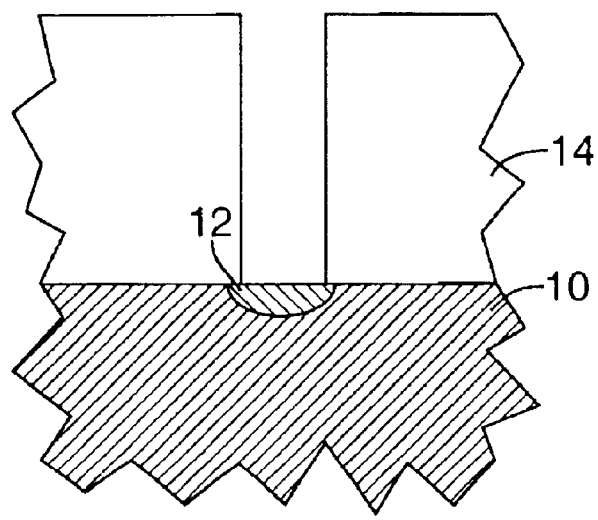
FIG. 6 is the cross section of FIG. 5 after cleaning.

Impacting hydrogen ions, together with the high temperature of the susceptor and the device under fabrication, act to clean the contact hole and the contact area therein by both physical and chemical means. The hydrogen chemically combines with and volatizes carbon-containing etch residues, and also scavenges oxygen from the native oxide on the contact area, converting $SiO_2$ to $SiO$ which then sublimates, leaving the contact area free of both etch residues and native oxide, as shown in FIG. 6. This hot hydrogen plasma clean is more fully described in U.S. patent application Ser. No. 09/360,292 by the present inventors, incorporated herein by reference.

Impacting dopant ions replace some or all of the dopant that tends to escape from the contact area during the cleaning process. The impacting dopant ions may even be used to replace dopant that may have been lost during the anisotropic etch of the contact hole or during other earlier process, or even to increase the dopant concentration near the surface of the contact area beyond any previously achieved level. Thus the dopant concentration at and near the surface of the contact area can be well controlled, insuring proper dopant concentration for reliable, low-resistivity contact formation.

In step 3, after the contact hole is cleaned and the dopant concentration in the contact area has been preserved or modified as desired, the cleaning and/or dopant gasses are evacuated from the vacuum chamber 22.

Figure 7:
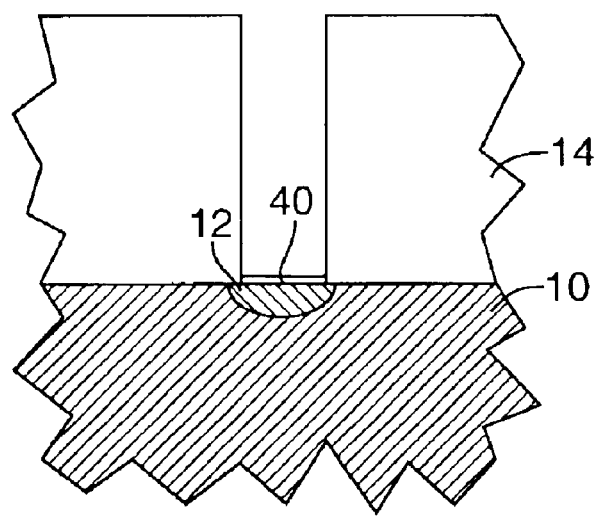
FIG. 7 is the cross section of FIG. 6 after deposition of a contact layer.

In step 4, a contact layer 40 shown in FIG. 7; which may be of titanium silicide ($TiSi_x$) or other suitable material, is then formed over the contact area by PCVD process(es), such as are known in the art, performed, for example, in situ in the chamber 22. Other materials usable as a contact layer include metal silicides such as $CoSi_x$, $PtSi_x$, etc. The titanium silicide layer provides a low resistivity interface or contact junction to the contact area and protects it from oxidation or other contamination and from further loss of dopant. Although not required, forming the silicide in situ in the chamber 22 immediately after cleaning is preferred because this insures that the newly cleaned and dopant-adjusted contact area is protected from any contamination or unwanted change of dopant concentration or profile, and allows reliable formation of contacts with high aspect ratios and with low resistance, such as 1000 $\Omega$ or less.

Figure 8:
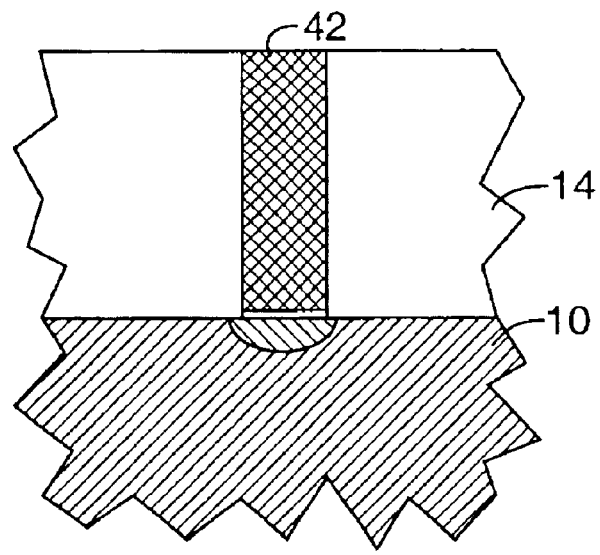
FIG. 8 is the cross section of FIG. 7 after the contact hole has been filled.

In step 5, the chamber is re-pressurized and the device under fabrication is removed. The contact hole with silicide layer therein is then ready for filling by a conductive material such as a metal, such as tungsten, to form a contact plug 42 as shown in FIG. 8. Alternatively, as with step 1, step 5 may be omitted or modified if additional processes, such as contact plug filling, are to take place in the chamber 22.

Step 2 may be performed in several ways, some examples of which are represented in the charts of FIGS. 4a–4d.

Figure 4:
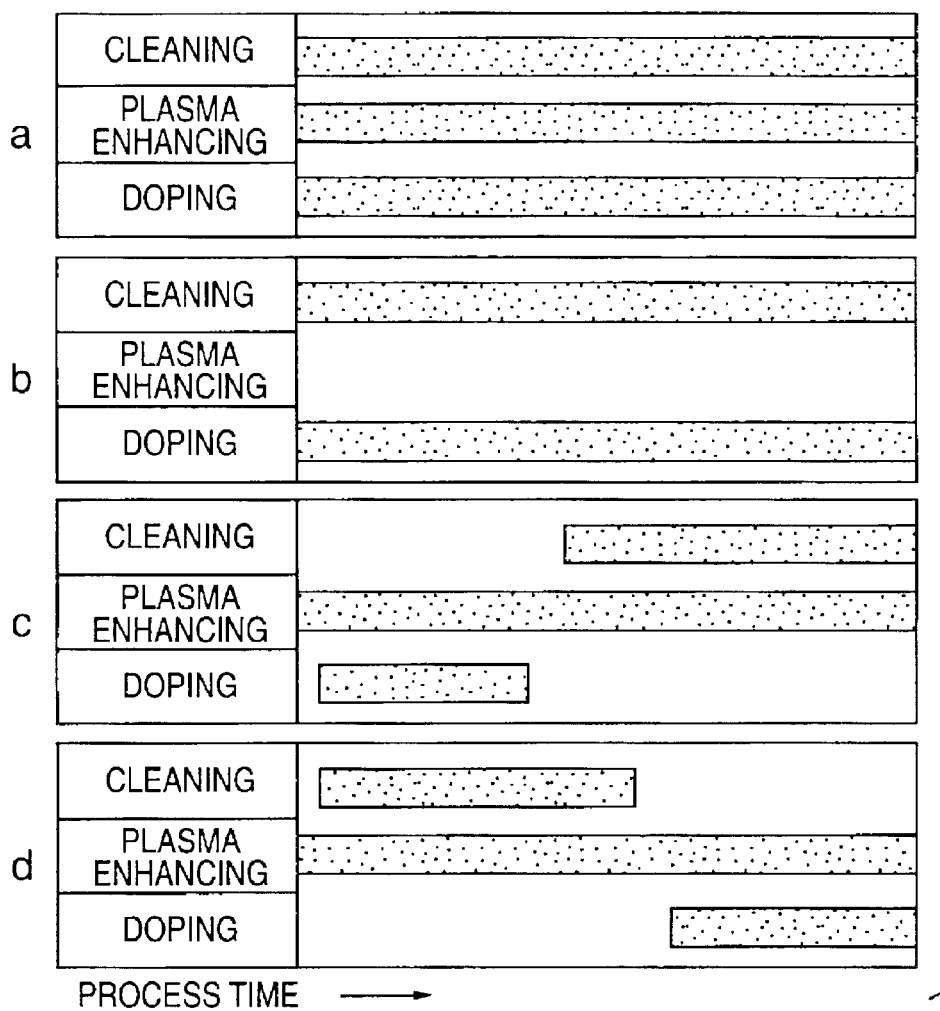
FIGS. 4a–4d are charts showing examples of variations in plasma constituents used in step 2 of FIG. 3.

As shown in FIG. 4, various plasma constituents may be used in various time orders in step 2 of the process of FIG. 3. The process may be performed by forming a plasma including cleaning constituents, a plasma enhancing constituents, and dopant constituents. The desirable cleaning constituent is hydrogen in the form of a hot hydrogen plasma, but other cleaning plasmas may be used. Plasma enhancing constituents include noble gasses and any other constituents that can enhance or alter ionization rates or other plasma characteristics without adversely affecting process chemistry. Doping constituents include any process compatible sources of desired dopants, such as sources of boron, phosphorous or arsenic. Diborane is a desirable dopant constituent for the formation of low resistivity contacts to P-type contact areas.

As shown in FIG. 4a, all three types of plasma constituents may be present in the plasma from the beginning to the end of step 2. Alternatively, as shown in FIG. 4b, cleaning constituents and a dopant constituent may be used without any additional plasma enhancing constituents.

As a further alternative, the cleaning plasma and the dopant plasma may be independent, or even completely separate in time from each other. For example, the dopant plasma may be used first, as shown in FIG. 4c, followed by the cleaning plasma. This variation allows the impinging dopant ions, traveling in the general direction of arrows A in FIG. 5, to travel through the uncleaned etch residue and the native oxide before reaching the surface of the contact area. This allows the dopant concentration from the impacting dopant ions to be concentrated somewhat closer to the surface of the contact area than would otherwise be possible. The etch residue and native oxide act as sacrificial layers, moving the dopant concentration profile toward the surface of the contact area, providing somewhat increased concentration dopant at the contact junction for formation of a low resistance contact.

The dopant plasma can also be used, if desired, only after the cleaning plasma, as shown in FIG. 4d. (The useful combinations and timing patterns are not limited to those shown in FIGS. 4a–4d, which are intended as examples only.)

Figure 9:
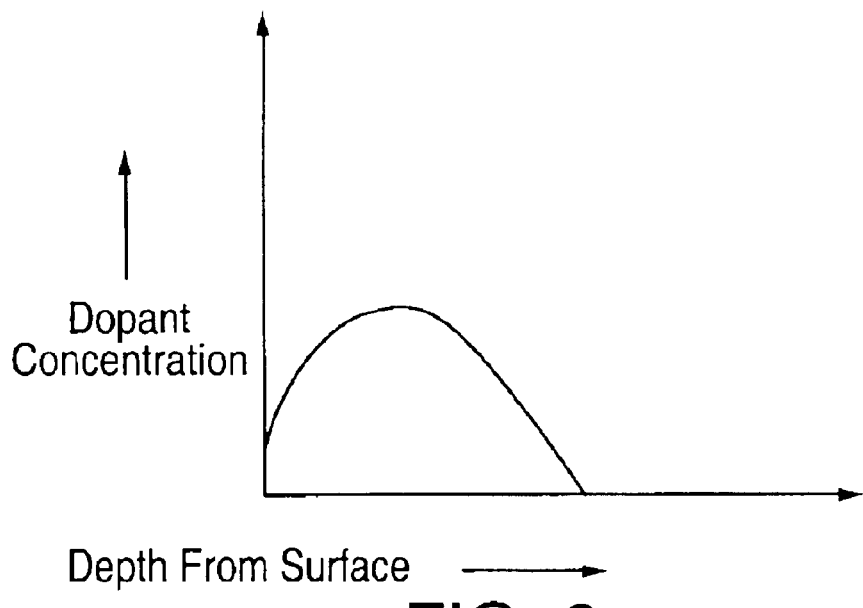
FIG. 9 is a graph of a typical dopant concentration profile resulting without use of the methods of the present invention.
Figure 10:
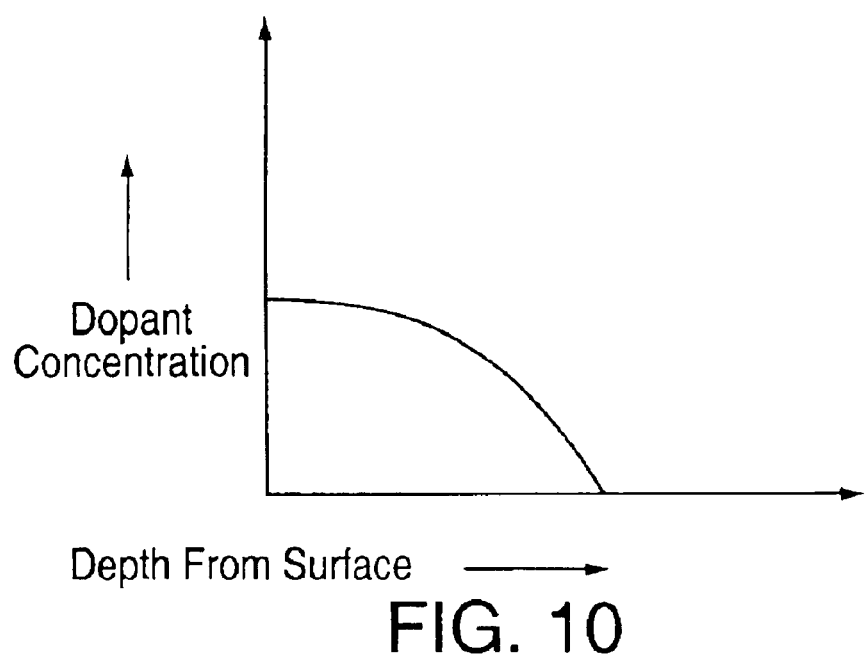
FIG. 10 is a graph of an improved dopant concentration profile achievable with the methods of the present invention.

Regardless of the particular detail of processes within step 2, an example of the resulting desired effect on the overall dopant profile is illustrated in the graphs of FIGS. 9 and 10. FIG. 9 shows a typical dopant profile without use of the dopant plasma. The junction depth is about 1200–2000 Angstroms, with dopant concentration being relatively low at the contact junction, increasing to a peak at a location spaced from the junction (from the surface of the contact area) and then decreasing from the maximum with increasing distance from the surface of the contact area. FIG. 10 shows one example of a desired dopant profile as modified by the processes of the present invention. The dopant penetration from the dopant plasma is only about 400 to about 500 Angstroms, allowing the region adjacent the surface of the contact area to be adequately doped. As shown for the profile of FIG. 10, in the example the dopant concentration is highest at the contact junction. The illustrated profile also decreases nonlinearly from the contact junction. Typically the desirable concentration of dopant at the contact junction is within at least about 90 percent of the maximum dopant concentration in the contact area. Most desirably the concentration of dopant in the contact area immediately adjacent to the contact junction is about equal to or greater than the maximum dopant concentration in the contact area.

Standard silicon dopants may be used: for example boron for P-type areas and phosphorous or arsenic for N-type areas, from any process-compatible source. For boron-doped contact areas, for example, the cleaning and doping plasmas may be one and the same, in the form of a hot hydrogen/diborane ($H_2/B_2H_6$) plasma. The diborane may be diluted in helium for improved delivery control. Argon may also be used to improve plasma formation characteristics. In a 6000 ccm process chamber at a pressure in the range of 1–5 Torr, examples of desirable gas flows include diborane in helium (at dilution of 50:1) of about 1 slm, and Argon and hydrogen each of about 50–100 sccm. An RF plasma can be struck at 13.56 MHz or other suitable frequency at a power of about 500–700 W, and the device in fabrication can be exposed to the plasma for about one-half minute. The susceptor can be biased within the ranges noted above with a specific example being 500 V. Increasing the bias voltage increases the accumulation of dopant in the contact area.

The process may be adjusted to achieve a shallow dopant penetration depth of 400–500 Angstroms into the surface of the contact area, at dopant concentration, for example, in the range of about $10^{18}$–$10^{21}$ atoms per cubic centimeter. In contrast to the typical junction depth below the contact area of 1200–2000 Angstroms, this shallow dopant profile provides sufficient dopant atoms at or near the contact surface for reliable low-resistivity contact formation. Titanium silicide may be formed in situ on the contact area to form the contact junction. Formation of the silicide layer in situ immediately following the cleaning and dopant-adjusting steps thus guarantees a clean, well-doped contact area for the silicide formation process.

The contact area has sufficient dopant (boron in the typical example) near to the contact surface to allow formation of a low resistivity junction between the doped silicon contact area and the contact layer 40 above. When the contact hole is filled, the resulting contact plug is electrically connected to the contact area via the contact layer, such as silicide, and the contact area has a dopant profile that desirably has a near constant or diminishing dopant concentration as a function of distance from the silicide junction, at least over a portion of the depth of the contact area. Other dopant profiles may also be achieved. A dopant concentration in the range of about $10^{18}$ to about $10^{21}$ atoms per cubic centimeter is preferably found within 500 Angstroms or less of the silicide junction. In some examples, as much as 60%–70% of the total dopant present in the contact area is "electrically active," i.e., the dopant is in a substitutional site of the silicon lattice rather than an interstitial site. The result is an improved contact with resistance reliably equal to or less than about 1000 Ω, providing for a high-density integrated circuit exhibiting improved reliability and yield.

The invention has been described herein with reference to a particular embodiments, but variations within the spirit and scope of the invention will occur to those skilled in the art. Accordingly, the scope of the invention is as defined in the appended claims.

We claim:

1. A method for forming an integrated circuit having low-resistivity contacts, the method comprising:
   providing a semiconductor structure having an overlying electrically insulating layer, the layer having a contact hole extending downward therein above a contact area on or in the semiconductor structure, the contact area comprising a doped semiconductor material;
   heating the semiconductor structure and simultaneously cleaning and adjusting a doping of the doped semiconductor material in the contact hole by exposing the structure in a vacuum chamber to a plasma comprising hydrogen and a dopant species; and
   within the vacuum chamber, forming a layer of conductive material in the contact hole.

2. The method of claim 1, wherein the stop of heating comprises heating the semiconductor structure to at least 600° C.

3. The method of claim 1, wherein the step of forming comprises forming a layer of titanium silicide on the contact area.

4. The method of claim 1, further comprising the step of biasing the semiconductor structure with a bias voltage in the range of about 0V to about 500V.

5. The method of claim 1, wherein the step of exposing comprises exposing the semiconductor structure to one playa containing both hydrogen ions and dopant ions.

6. The method of claim 1, wherein the step of exposing comprises exposing the semiconductor structure to a plasma containing a noble gas.

7. A method for forming an integrated circuit having low-resistive contacts, the method comprising:

heating and simultaneously cleaning and adjusting a dopant concentration of, in a plasma comprising hydrogen and a dopant, a contact hole formed in an electrically insulating layer above a contact area, the contact area comprising a semiconductor material containing the dopant; and depositing a conductive material into the contact hole.

8. A method for simultaneously cleaning and adjusting a doping of a surface of a semiconductor structure comprising:

heating the surface; and providing a dopant species and a cleaning species in a plasma, wherein the dopant species is different from the cleaning species and is supplied at least in part from a source other than the semiconductor structure.

9. The method of claim 8, in which the plasma comprises hydrogen plasma.

10. The method of claim 9, further including the step of heating the semiconductor structure.

11. The method of claim 8, in which the dopant species is boron supplied in the form of diborane.

12. Cleaning a surface of a heated semiconductor structure containing a dopant species and adjusting a dopant concentration of the dopant species in a plasma that comprises a cleaning species and a dopant species that is supplied at least in pan from a source other than the semiconductor structure, wherein the dopant species is different from the cleaning species.

13. The cleaning of claim 12, wherein the cleaning species is hydrogen.

14. The cleaning of claim 12, in which the dopant species is boron supplied in the form of diborane.

15. The cleaning of claim 12, wherein the dopant species is selected from the group consisting essentially of boron, phosphorous, and arsenic.

* * * * *